(12) United States Patent
Ohi et al.

(10) Patent No.: US 7,116,185 B2
(45) Date of Patent: Oct. 3, 2006

(54) BALUN

(75) Inventors: Shoichi Ohi, Tokyo (JP); Hideya Matsubara, Tokyo (JP); Naoto Ohyama, Tokyo (JP)

(73) Assignee: TDK Corporation, Tokyo (JP)

( * ) Notice: Subject to any disclaimer, the term of this patent is extended or adjusted under 35 U.S.C. 154(b) by 37 days.

(21) Appl. No.: 10/994,606

(22) Filed: Nov. 23, 2004

(65) Prior Publication Data

US 2005/0116787 A1 Jun. 2, 2005

(30) Foreign Application Priority Data

Nov. 28, 2003 (JP) .............................. 2003-399593

(51) Int. Cl.
*H03H 7/42* (2006.01)
*H01P 5/12* (2006.01)

(52) U.S. Cl. ........................... 333/25; 333/26; 333/100
(58) Field of Classification Search ................. 333/25, 333/26, 100, 118, 185
See application file for complete search history.

(56) References Cited

U.S. PATENT DOCUMENTS

| 5,949,299 | A | | 9/1999 | Harada .......................... 333/25 |
| 6,052,039 | A | * | 4/2000 | Chiou et al. ................. 333/100 |
| 6,285,273 | B1 | | 9/2001 | Morikawa .................... 336/200 |
| 6,850,127 | B1 | * | 2/2005 | Sakakura et al. ............. 333/25 |

FOREIGN PATENT DOCUMENTS

| EP | 1 100 193 A2 | 5/2001 |
| FR | 917 372 A | 1/1947 |
| JP | 09-260145 A | 10/1997 |
| JP | 10-200360 A | 7/1998 |
| JP | 2000-188218 | 7/2000 |
| JP | 2002-190413 | 7/2002 |

OTHER PUBLICATIONS

Chiou et al.; "Lumped-Element Compensated High/Low-Pass Balun Design for MMIC Double-Balanced Mixer"; IEEE Microwave and Guided Wave Letters; vol. 7, No. 8; pp. 248-250; XP 000658633; Aug. 1997.
Penunuri et al.; "RF Filter Design Using LTCC and Thin Film Baw Technology"; 2001 IEEE Ultrasonics Symposium; pp. 273-278; XP 010584525; Oct. 7, 2001.
Rothammel; "Antennenbuch, 10. Auflage"; Kapitel 6 and 7, Franckh-Kosmos Verlag, Stuttgart; Germany; XP 002321146; with partial translation.
Parisi; "180 Degrees Lumped Element Hybrid"; Microwave Symposium Digest; IEEE MTT-S International; vol. 3, pp. 1243-1246; XP 010085524; Jun. 13, 1989.
Scrantom et al.; "LTCC Technology: Where We are and Where We're Going-II"; Technologies for Wireless Applications; pp. 193-200; XP 010326263; Feb. 21, 1999.

\* cited by examiner

*Primary Examiner*—Dean Takaoka
(74) *Attorney, Agent, or Firm*—Oliff & Berridge, PLC

(57) ABSTRACT

A balun comprises an unbalanced terminal, two balanced terminals, and two ground terminals. The balun further comprises: a low-pass filter provided between the unbalanced terminal and one of the balanced terminals; and a high-pass filter provided between the unbalanced terminal and the other of the balanced terminals. The low-pass filter incorporates two coils and a capacitor. The high-pass filter incorporates two capacitors and a coil. The coils and the capacitors are made up of conductor layers of a multi-layer substrate.

13 Claims, 12 Drawing Sheets

BALUN

BACKGROUND OF THE INVENTION

1. Field of the Invention

The present invention relates to a balun for transforming a balanced signal to an unbalanced signal and vice versa.

2. Description of the Related Art

A balun (balanced-unbalanced transformer) is a device for transforming a balanced signal to an unbalanced signal and vice versa. Here, an unbalanced signal is a signal of which reference potential is the ground potential. A balanced signal is made up of two signals that are nearly 180 degrees out of phase with each other and have nearly equal amplitudes. The balun has two balanced terminals for receiving and outputting balanced signals and one unbalanced terminal for receiving and outputting unbalanced signals.

Baluns are used in mobile communications devices including cellular phones and communications devices for radio local area network (LAN). Reductions in size and thickness of the mobile communications devices have been strongly sought, and techniques for mounting components with higher density have been therefore required. Integration of components through the use of a multi-layer substrate has been thus proposed. The multi-layer substrate is a layered structure including dielectric layers and patterned conductor layers alternately stacked.

Many of conventional baluns that have been widely used are those having at least two pairs of quarter-wave strip lines electromagnetically coupled to each other (which are called electromagnetic-coupling-type baluns in the present patent application). Various sorts of multi-layer electromagnetic-coupling-type baluns made by using multi-layer substrates have been proposed, too, as disclosed in the Published Unexamined Japanese Patent Application Heisei 9-260145 (1997), the Published Unexamined Japanese Patent Application 2000-188218, and the Published Unexamined Japanese Patent Application 2002-190413, for example.

It is required for the electromagnetic-coupling-type baluns that a higher degree of coupling be achieved between a pair of quarter-wave strip lines. However, a problem of multi-layer electromagnetic-coupling-type baluns is that it is difficult to increase the coupling between a pair of quarter-wave strip lines, and that insertion loss is thereby increased.

Regarding this problem, the Published Unexamined Japanese Patent Application Heisei 10-200360 (1998) discloses a balun using a high-pass filter and a low-pass filter (which is called a filter-type balun in the present patent application) as a balun that is capable of reducing insertion loss even if formed to have a multi-layer structure.

In the filter-type balun disclosed in the Published Unexamined Japanese Patent Application Heisei 10-200360, the high-pass filter and the low-pass filter is each made up of an LC circuit comprising a single coil and a single capacitor. This filter-type balun is capable of making insertion loss smaller, compared with the electromagnetic-coupling-type balun. However, the filter-type balun has a problem that, in a neighborhood of the frequency band in which the balun is used, the difference in amplitude between output signals at the two balanced terminals greatly varies, depending on frequencies, and this narrows the frequency range in which the difference in amplitude of output signals at the two balanced terminals satisfies a desired standard.

A multi-layer filter-type balun achieves a reduction in size of the balun. However, electromagnetic interference often occurs among a plurality of coils of the multi-layer balun. Such interference causes a difference between desired characteristics of the balun as designed and characteristics of the balun actually fabricated. It is therefore difficult to fabricate the balun that has the desired characteristics.

OBJECTS AND SUMMARY OF THE INVENTION

It is a first object of the invention to provide a balun that develops a small insertion loss and a small difference in amplitude between output signals at two balanced terminals in a wide frequency range.

It is a second object of the invention to provide a balun that develops a small insertion loss, that is capable of achieving a reduction in size, and that easily achieves desired characteristics.

A first balun of the invention comprises: an unbalanced terminal for receiving and outputting unbalanced signals; a first balanced terminal and a second balanced terminal for receiving and outputting balanced signals; a low-pass filter provided between the unbalanced terminal and the first balanced terminal; and a high-pass filter provided between the unbalanced terminal and the second balanced terminal. The low-pass filter incorporates at least two coils and at least one capacitor. The high-pass filter incorporates at least two capacitors and at least one coil.

According to the first balun of the invention, when an unbalanced signal is inputted to the unbalanced terminal, this signal is fed through the low-pass filter and is outputted from the first balanced terminal with a phase delay of nearly 90 degrees, and the signal is fed through the high-pass filter and is outputted from the second balanced terminal with a phase lead of nearly 90 degrees. As a result, the signal outputted from the first balanced terminal and the signal outputted from the second balanced terminal are two signals nearly 180 degrees out of phase, that is, two signals making up a balanced signal. When two signals making up a balanced signal are inputted to the first and second balanced terminals, the signal inputted to the first balanced terminal passes through the low-pass filter and reaches the unbalanced terminal with a phase delay of nearly 90 degrees, and the signal inputted to the second balanced terminal passes through the high-pass filter and reaches the unbalanced terminal with a phase lead of nearly 90 degrees. As a result, an unbalanced signal is outputted from the unbalanced terminal. According to the first balun of the invention, the low-pass filter incorporates at least two coils and at least one capacitor. The high-pass filter incorporates at least two capacitors and at least one coil. As a result, the difference in amplitude between output signals at the two balanced terminals is small in a wide frequency range.

The first balun of the invention may further comprise a layered structure including dielectric layers and conductor layers alternately stacked, wherein the coils and the capacitors are made up of the conductor layers. In this case, the unbalanced terminal and the first and second balanced terminals may be disposed on the periphery of the layered structure, so that the balun makes up a single chip-shaped electronic component. Furthermore, at least three coils including the two coils of the low-pass filter and the one coil of the high-pass filter may be provided in locations that do not overlap one another when seen in a direction orthogonal to the layers of the layered structure. The first balun of the invention may further comprise a separating section made up of the conductor layers and electromagnetically separating the at least three coils from one another.

The first balun of the invention may further comprise a ground terminal connected to the ground. In addition, the low-pass filter may incorporate: a first coil having an end connected to the unbalanced terminal; a second coil having an end connected to the other end of the first coil and having the other end connected to the first balanced terminal; and a first capacitor having an end connected to the other end of the first coil and having the other end connected to the ground terminal, and the high-pass filter may incorporate: a second capacitor having an end connected to the unbalanced terminal; a third capacitor having an end connected to the other end of the second capacitor and having the other end connected to the second balanced terminal; and a third coil having an end connected to the other end of the second capacitor and having the other end connected to the ground terminal.

In the first balun of the invention, it is possible that neither the signal path between the unbalanced terminal and the first balanced terminal nor the signal path between the unbalanced terminal and the second balanced terminal includes a portion for transmitting signals through electromagnetic coupling.

A second balun of the invention comprises: an unbalanced terminal for receiving and outputting unbalanced signals; a first balanced terminal and a second balanced terminal for receiving and outputting balanced signals; a low-pass filter provided between the unbalanced terminal and the first balanced terminal; a high-pass filter provided between the unbalanced terminal and the second balanced terminal, and a layered structure including dielectric layers and conductor layers alternately stacked. The low-pass filter and the high-pass filter include a total of at least three coils made up of the conductor layers. The at least three coils are provided in locations that do not overlap one another when seen in the direction orthogonal to the layers of the layered structure.

The second balun of the invention may further comprise a separating section made up of the conductor layers and electromagnetically separating the at least three coils from one another.

The first balun of the invention has a configuration including the low-pass filter and the high-pass filter. It is thereby possible to implement the balun having a small insertion loss. In the first balun of the invention the low-pass filter incorporates at least two coils and at least one capacitor. The high-pass filter incorporates at least two capacitors and at least one coil. As a result, the difference in amplitude between output signals at the two balanced terminals is small in a wide frequency range.

It is possible to reduce the balun in size when the first balun of the invention further comprises the layered structure including the dielectric layers and the conductor layers alternately stacked, and the coils and the capacitors are made up of the conductor layers.

According to the first balun of the invention, when at least three coils including the two coils of the low-pass filter and the one coil of the high-pass filter are provided in the locations that do not overlap one another when seen in the direction orthogonal to the layers of the layered structure, it is possible to prevent electromagnetic interference among the at least three coils so as to implement desired characteristics of the balun easily.

When the first balun of the invention further comprises the separating section made up of the conductor layers and electromagnetically separating the at least three coils from one another, it is possible to prevent electromagnetic interference among the at least three coils with greater reliability.

The second balun of the invention has a configuration including the low-pass filter and the high-pass filter. It is thereby possible to implement the balun having a small insertion loss. The second balun of the invention comprises the layered structure including the dielectric layers and the conductor layers alternately stacked. The low-pass filter and the high-pass filter include a total of at least three coils made up of the conductor layers. The at least three coils are provided in the locations that do not overlap one another when seen in the direction orthogonal to the layers of the layered structure. According to the invention, it is thereby possible to reduce the balun in size and to prevent electromagnetic interference among the at least three coils so as to implement desired characteristics of the balun easily.

When the second balun of the invention further comprises the separating section made up of the conductor layers and electromagnetically separating the at least three coils from one another, it is possible to prevent electromagnetic interference among the at least three coils with greater reliability.

Other and further objects, features and advantages of the invention will appear more fully from the following description.

DESCRIPTION OF PREFERRED EMBODIMENTS

Preferred embodiments of the invention will now be described in detail with reference to the accompanying drawings.

[First Embodiment]

Figure 1:
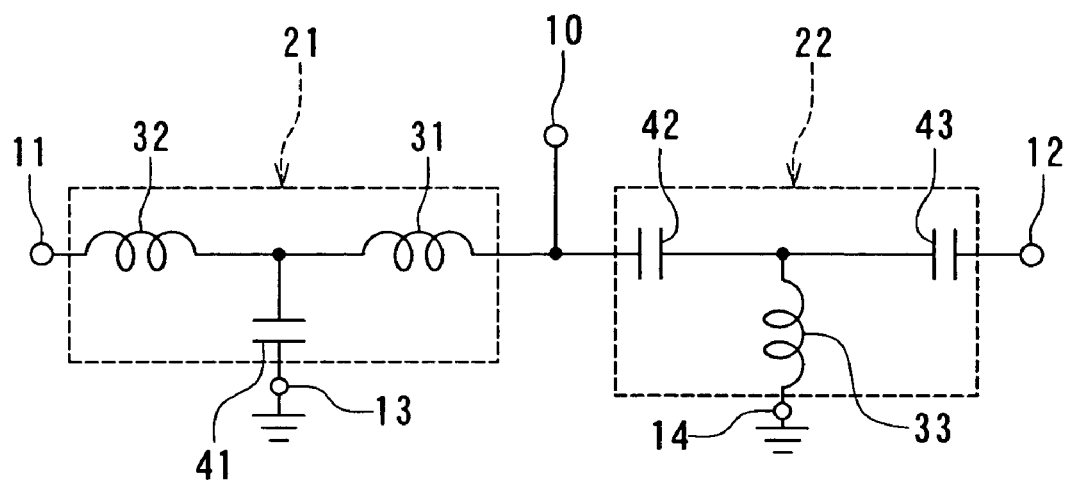
FIG. 1 is a schematic diagram illustrating the configuration of a balun of a first embodiment of the invention.

Reference is now made to FIG. 1 to describe the circuit configuration of a balun of a first embodiment of the invention. The balun of the embodiment comprises: an unbalanced terminal 10 for receiving and outputting unbalanced signals; a first balanced terminal 11 and a second balanced terminal 12 for receiving and outputting balanced signals; and two ground terminals 13 and 14 connected to the ground. The balun further comprises: a low-pass filter 21 provided between the unbalanced terminal 10 and the first balanced terminal 11; and a high-pass filter 22 provided between the unbalanced terminal 10 and the second balanced terminal 12.

The low-pass filter 21 incorporates: a first coil 31 having an end connected to the unbalanced terminal 10; a second coil 32 having an end connected to the other end of the first coil 31 and having the other end connected to the first balanced terminal 11; and a first capacitor 41 having an end connected to the other end of the first coil 31 and having the other end connected to the ground terminal 13. The high-pass filter 22 incorporates: a second capacitor 42 having an end connected to the unbalanced terminal 10; a third capacitor 43 having an end connected to the other end of the second capacitor 42 and having the other end connected to the second balanced terminal 12; and a third coil 33 having an end connected to the other end of the second capacitor 42 and having the other end connected to the ground terminal 14.

According to the balun of the embodiment, neither the signal path between the unbalanced terminal 10 and the first balanced terminal 11 nor the signal path between the unbalanced terminal 10 and the second balanced terminal 12 includes a portion for transmitting signals through electromagnetic coupling.

The operation of the balun of the embodiment will now be described. In the balun, when an unbalanced signal is inputted to the unbalanced terminal 10, this signal is fed through the low-pass filter 21 and is outputted from the balanced terminal 11 with a phase delay of nearly 90 degrees, and the signal is fed through the high-pass filter 22 and is outputted from the balanced terminal 12 with a phase lead of nearly 90 degrees. As a result, the signal outputted from the balanced terminal 11 and the signal outputted from the balanced terminal 12 are two signals nearly 180 degrees out of phase with each other, that is, two signals making up a balanced signal. When two signals making up a balanced signal are inputted to the balanced terminals 11 and 12, the signal inputted to the balanced signal 11 passes through the low-pass filter 21 and reaches the unbalanced terminal 10 with a phase delay of nearly 90 degrees, and the signal inputted to the balanced signal 12 passes through the high-pass filter 22 and reaches the unbalanced terminal 10 with a phase lead of nearly 90 degrees. As a result, an unbalanced signal is outputted from the unbalanced terminal 10.

Figure 2:
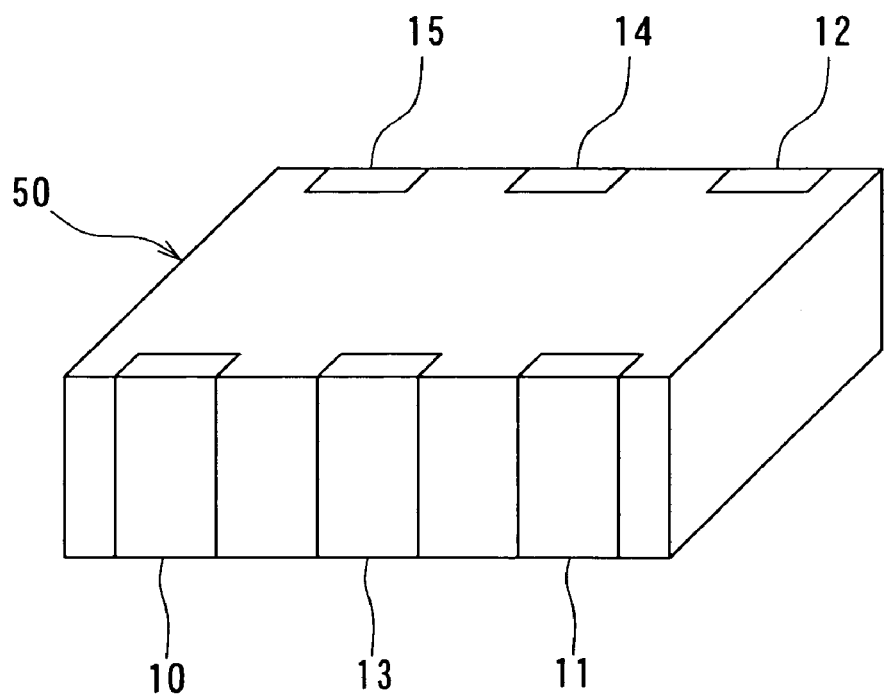
FIG. 2 is a perspective view illustrating the appearance of the balun of the first embodiment of the invention.

Reference is now made to FIG. 2 and FIG. 3A to FIG. 3G to describe the structure of the balun of the embodiment. FIG. 2 is a perspective view illustrating the appearance of the balun of the embodiment. As shown in FIG. 2, the balun comprises a multi-layer substrate 50 that is a layered structure including dielectric layers and conductor layers alternately stacked. The coils and the capacitors of FIG. 1 are made up of the conductor layers. The unbalanced terminal 10, the balanced terminals 11 and 12, the ground terminals 13 and 14, and a terminal 15 are provided on the top surface, the bottom surface and the side surfaces of the multi-layer substrate 50. The terminals 10 to 15 are connected to the conductor layers inside the multi-layer substrate 50. The terminals 10 to 14 are connected to an external circuit while the terminal 15 is not connected to the external circuit. According to the embodiment as thus described, the terminals 10 to 15 are disposed on the periphery of the multi-layer substrate 50 such that the balun makes up a single chip-shaped electronic component that is nearly hexahedron-shaped.

FIG. 3A to FIG. 3G illustrate examples of configurations of layers of the multi-layer substrate 50 making up the balun of the embodiment. FIG. 3A to FIG. 3G illustrate first to seventh conductor layers from the top and a dielectric layer therebelow.

Figure 3A:
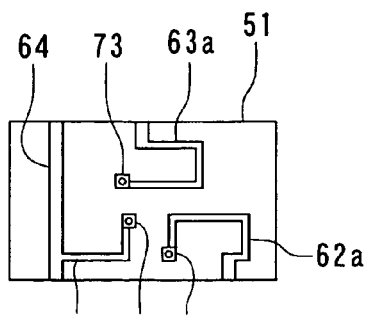
FIG. 3A to FIG. 3G illustrate examples of configurations of layers of the multi-layer substrate making up the balun of the first embodiment of the invention.

On the top surface of the dielectric layer 51 of FIG. 3A, three conductor layers 61a, 62a and 63a for coils and a conductor layer 64 are formed. The dielectric layer 51 has through holes 71, 72 and 73. The conductor layers 61a, 62a and 63a make up portions of the coils 31, 32 and 33, respectively. The conductor layer 64 has an end connected to the unbalanced terminal 10 and the other end connected to the terminal 15. The conductor layer 61a has an end connected to the conductor layer 64 and the other end connected to the through hole 71. The conductor layer 62a has an end connected to the balanced terminal 11 and the other end connected to the through hole 72. The conductor layer 63a has an end connected to the ground terminal 14 and the other end connected to the through hole 73.

Figure 3B:
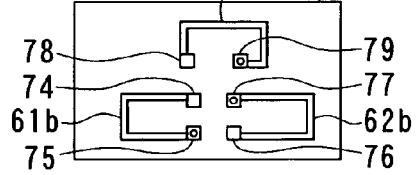

On the top surface of the dielectric layer 52 of FIG. 3B, three conductor layers 61b, 62b and 63b for coils and conductor layers 74, 76 and 78 for connection to the through holes are formed. The dielectric layer 52 has through holes 75, 77 and 79. The conductor layers 61b, 62b and 63b make up portions of the coils 31, 32 and 33, respectively. The conductor layer 61b has an end connected to the conductor layer 74 and the other end connected to the through hole 75. The conductor layer 62b has an end connected to the conductor layer 76 and the other end connected to the through hole 77. The conductor layer 63a has an end connected to the conductor layer 78 and the other end connected to the through hole 79. The conductor layers 74, 76 and 78 are connected to the through holes 71, 72 and 73 of FIG. 3A, respectively.

Figure 3C:
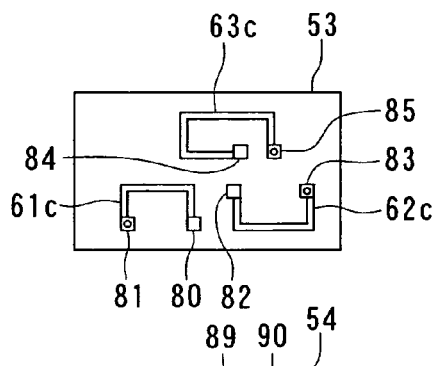

On the top surface of the dielectric layer 53 of FIG. 3C, three conductor layers 61c, 62c and 63c for coils and conductor layers 80, 82 and 84 for connection to the through holes are formed. The dielectric layer 53 has through holes 81, 83 and 85. The conductor layers 61c, 62c and 63c make up portions of the coils 31, 32 and 33, respectively. The conductor layer 61c has an end connected to the conductor layer 80 and the other end connected to the through hole 81. The conductor layer 62c has an end connected to the conductor layer 82 and the other end connected to the through hole 83. The conductor layer 63c has an end connected to the conductor layer 84 and the other end connected to the through hole 85. The conductor layers 80, 82 and 84 are connected to the through holes 75, 77 and 79 of FIG. 3B, respectively.

Figure 3D:
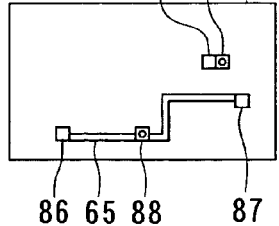

On the top surface of the dielectric layer 54 of FIG. 3D, a conductor layer 65 and conductor layers 86, 87 and 89 for connection to the through holes are formed. The dielectric layer 54 has through holes 88 and 90. The conductor layer 65 has an end connected to the conductor layer 86 and the other end connected to the conductor layer 87. The through hole 88 is connected to a portion in a middle of the conductor layer 65. The conductor layer 89 is connected to the through hole 90. The conductor layers 86, 87 and 89 are connected to the through holes 81, 83 and 85 of FIG. 3C, respectively.

Figure 3E:
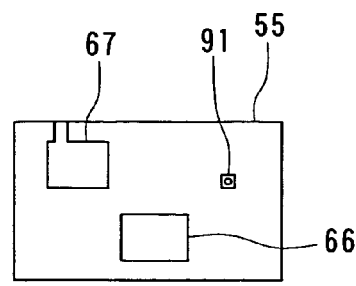

On the top surface of the dielectric layer 55 of FIG. 3E, conductor layers 66 and 67 for capacitors are formed. The dielectric layer 55 has a through hole 91. The conductor layer 66 is connected to the through hole 88 of FIG. 3D. The conductor layer 67 is connected to the terminal 15. The though hole 91 is connected to the through hole 90 of FIG. 3D.

Figure 3F:
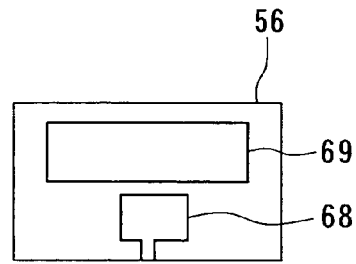

On the top surface of the dielectric layer 56 of FIG. 3F, conductor layers 68 and 69 for capacitors are formed. The conductor layer 68 is opposed to the conductor layer 66 of FIG. 3E. The conductor layer 69 is opposed to the conductor layer 67 of FIG. 3E. The conductor layers 66 and 68 make up the capacitor 41. The conductor layers 67 and 69 make up the capacitor 42. The conductor layer 68 is connected to the ground terminal 13. The conductor layer 69 is connected to the though hole 91 of FIG. 3E.

Figure 3G:
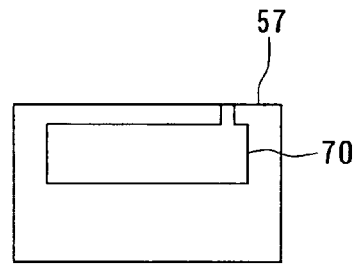

On the top surface of the dielectric layer 57 of FIG. 3G, a conductor layer 70 for a capacitor is formed. The conductor layer 70 is opposed to the conductor layer 69 of FIG. 3F. The conductor layers 69 and 70 make up the capacitor 43. The conductor layer 70 is connected to the balanced terminal 12.

According to the embodiment, as shown in FIG. 3A to FIG. 3G, the two coils 31 and 32 of the low-pass filter 21 and the single coil 33 of the high-pass filter 22 are provided in locations that do not overlap one another when seen in the direction orthogonal to the layers of the multi-layer substrate 50.

The multi-layer substrate 50 is a multi-layer substrate of low-temperature co-fired ceramic, for example. In this case, the multi-layer substrate 50 may be fabricated through the following steps. First, a ceramic green sheet having holes to be used as the through holes is provided. On this sheet a conductor layer having a specific pattern is formed, using a conductive paste whose main ingredient is silver, for example. Next, a plurality of ceramic green sheets having such conductor layers are stacked and these are fired at the same time. The through holes are thereby formed at the same time, too. Next, the terminals 10 to 15 are formed so that the multi-layer substrate 50 is completed.

As thus described, the balun of the embodiment is made up of the low-pass filter 21 and the high-pass filter 22. As a result, the balun that has a small insertion loss is achieved, according to the embodiment.

According to the balun of the embodiment, the low-pass filter 21 incorporates the two coils 31 and 32 and the single capacitor 41, and the high-pass filter 22 incorporates the two capacitors 42 and 43 and the single coil 33. As a result, according to the balun of the embodiment, the difference in amplitude between output signals at the two balanced terminals 11 and 12 is small in a wider frequency range, compared with a balun comprising a high-pass filter and a low-pass filter each of which is made of an LC circuit made up of a single coil and a single capacitor. This feature will now be described, using a result of a simulation.

Figure 4:
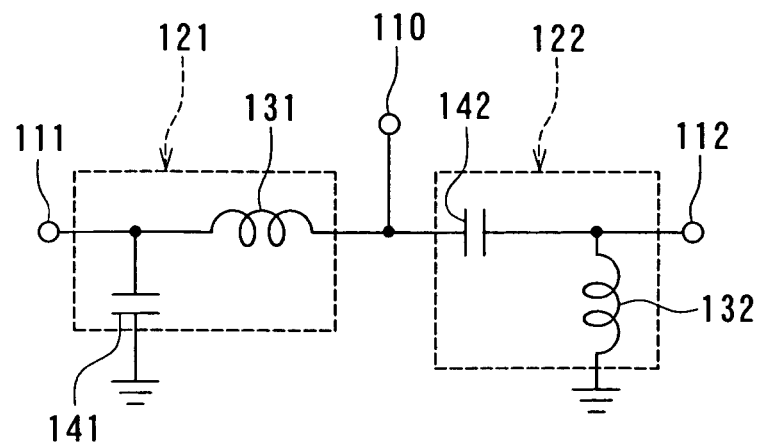
FIG. 4 is a schematic diagram illustrating the circuit configuration of a reference balun used in a simulation.

FIG. 4 is a schematic diagram illustrating the circuit configuration of a reference balun used in the simulation. The reference balun comprises: an unbalanced terminal 110 for receiving and outputting unbalanced signals; and a first balanced terminal 111 and a second balanced terminal 112 for receiving and outputting balanced signals. The reference balun further comprises: a low-pass filter 121 provided between the unbalanced terminal 110 and the first balanced terminal 111; and a high-pass filter 122 provided between the unbalanced terminal 110 and the second balanced terminal 112. The low-pass filter 121 incorporates: a coil 131 having an end connected to the unbalanced terminal 110 and the other end connected to the first balanced terminal 111; and a capacitor 141 having an end connected to the other end of the coil 131 and having the other end grounded. The high-pass filter 122 incorporates: a capacitor 142 having an end connected to the unbalanced terminal 110 and the other end connected to the second balanced terminal 112; and a coil 132 having an end connected to the other end of the capacitor 142 and having the other end grounded. In the simulation each of the coils 131 and 132 has an inductance of 8.0 nH, and each of the capacitors 141 and 142 has a capacitance of 0.88 pF.

The balun of the embodiment of the invention used in the simulation has the circuit configuration as shown in FIG. 1. In the simulation the coils 31, 32 and 33 have inductances of 5.2 nH, 5.4 nH and 5.1 nH, respectively, and the capacitors 41, 42 and 43 have capacitances of 0.55 pF, 0.64 pF and 2.43 pF, respectively.

Figure 5:
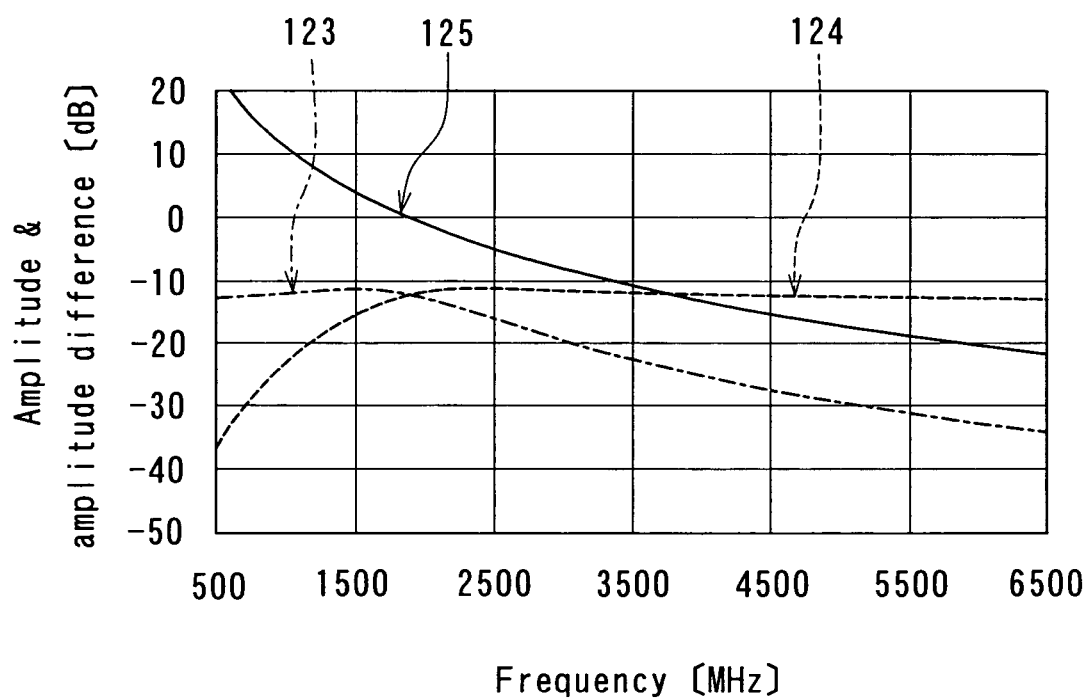
FIG. 5 is a plot showing a frequency characteristic of difference in amplitude between output signals at the two balanced terminals of the reference balun of FIG. 4.
Figure 6:
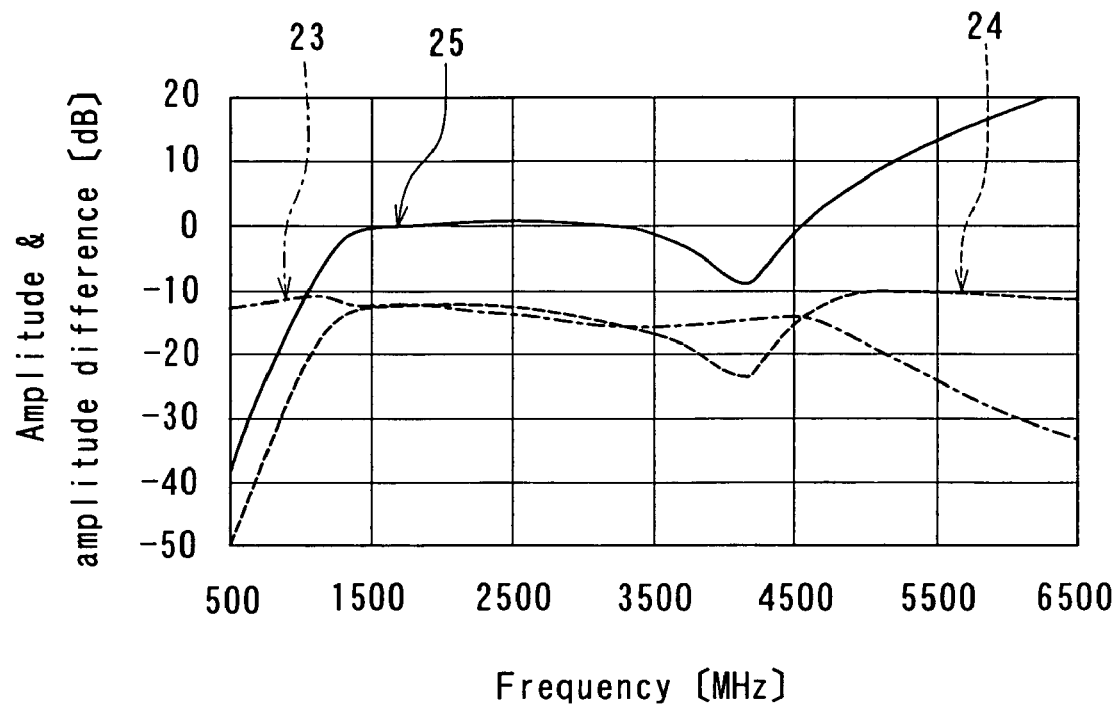
FIG. 6 is a plot showing a frequency characteristic of difference in amplitude between output signals at the two balanced terminals of the balun of the first embodiment of the invention.

FIG. 5 and FIG. 6 show the result of the simulation. FIG. 5 shows the frequency characteristics of the amplitude of an output signal of the low-pass filter 121 of the reference balun of FIG. 4, the amplitude of an output signal of the high-pass filter 122, and the difference in amplitude between output signals at the two balanced terminals 111 and 112 (which is hereinafter called the amplitude difference). In FIG. 5 numeral 123 indicates the amplitude of the output signal of the low-pass filter 121. Numeral 124 indicates the amplitude of the output signal of the high-pass filter 122. Numeral 125 indicates the amplitude difference. The amplitude difference is expressed by the difference between the amplitude of the output signal of the low-pass filter 121 and the amplitude of the output signal of the high-pass filter 122.

FIG. 6 shows the frequency characteristics of the amplitude of an output signal of the low-pass filter 21 of the balun of the embodiment shown in FIG. 1, the amplitude of an output signal of the high-pass filter 22, and the difference in amplitude between output signals at the two balanced terminals 11 and 12 (which is hereinafter called the amplitude difference). In FIG. 6 numeral 23 indicates the amplitude of the output signal of the low-pass filter 21. Numeral 24 indicates the amplitude of the output signal of the high-pass filter 22. Numeral 25 indicates the amplitude difference. The amplitude difference is expressed by the difference between the amplitude of the output signal of the low-pass filter 21 and the amplitude of the output signal of the high-pass filter 22.

As the comparison between the amplitude differences of FIG. 5 and FIG. 6 shows, the amplitude difference of the balun of the embodiment is small in a wider frequency range, compared with the reference balun. The reason would be the difference in frequency characteristics of the amplitudes of the output signals of the low-pass filter and the high-pass filter between the reference balun and the balun of the embodiment. That is, the frequency characteristics of the amplitudes of the output signals of the low-pass filter and the high-pass filter of the reference balun each form a smooth curve. Consequently, the frequency characteristic of the amplitude difference of the reference balun forms a curve that is an approximation of a straight line that is greatly inclined. In contrast, the frequency characteristics of the amplitudes of the output signals of the low-pass filter and the high-pass filter of the balun of the embodiment each form a curve having ripples. Consequently, the frequency characteristic of the amplitude difference of the balun of the embodiment forms a curve having a flat portion located around the point at which the amplitude difference is 0 (dB).

Figure 7:
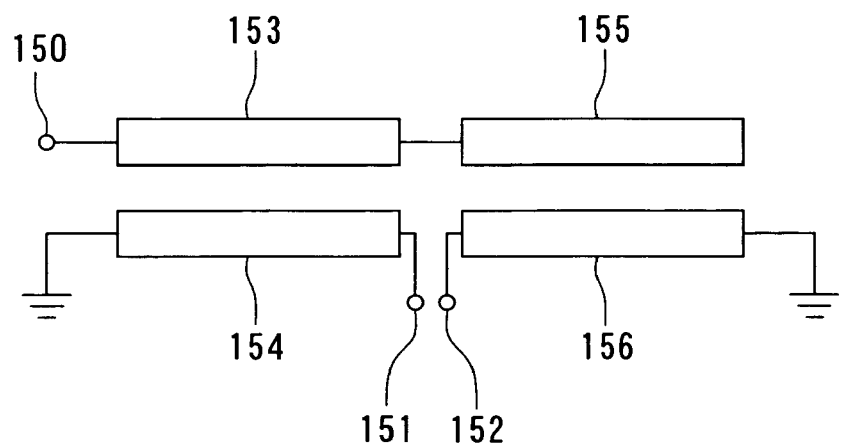
FIG. 7 is a schematic diagram illustrating the configuration of an electromagnetic-coupling-type balun.

Examples of characteristics obtained through actual measurements will now be given for an example of an electromagnetic-coupling-type balun, the reference balun shown in FIG. 4, and the balun of the embodiment of the invention shown in FIG. 1. FIG. 7 is a schematic diagram illustrating the configuration of the electromagnetic-coupling-type balun employed here. The electromagnetic-coupling-type balun comprises: an unbalanced terminal 150 for receiving and outputting unbalanced signals; and a first balanced terminal 151 and a second balanced terminal 152 for receiving and outputting balanced signals. The balun further comprises: a pair of quarter-wave strip lines 153 and 154 electromagnetically coupled to each other; and a pair of quarter-wave strip lines 155 and 156 electromagnetically coupled to each other. The strip line 153 has an end connected to the unbalanced terminal 150 and the other end connected to an end of the strip line 155. The strip line 155 has the other end that is open-circuited. The strip lines 154 and 156 have ends that are opposed to each other and connected to the balanced terminals 151 and 152, respectively. Each of the strip lines 154 and 156 has the other end grounded.

For the reference balun and the balun of the embodiment employed here, the inductances of the coils and the capacitances of the capacitors are the same as those of the above-described simulation.

Figure 8:
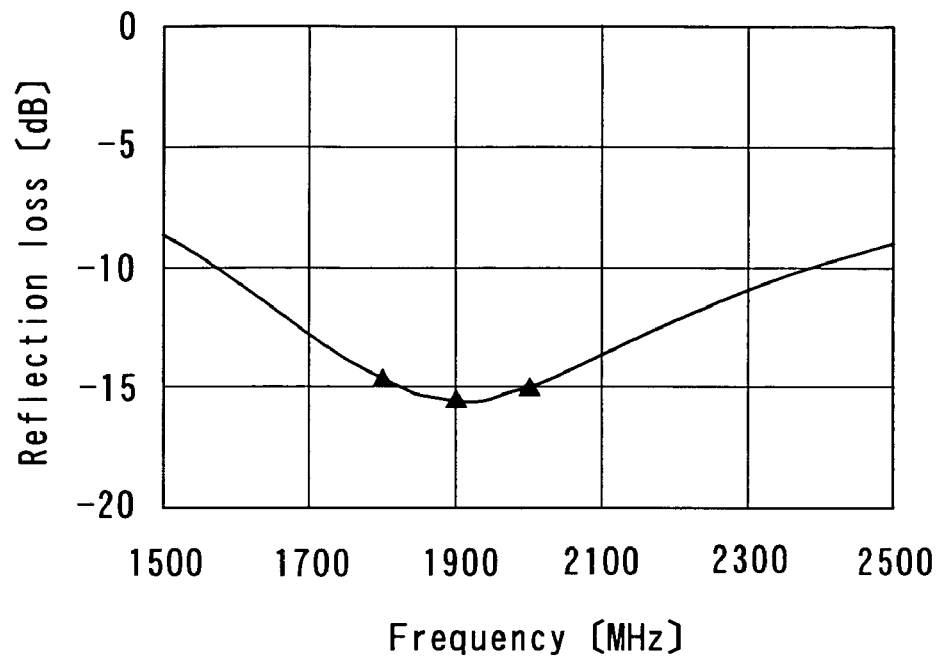
FIG. 8 is a plot showing a frequency characteristic of reflection loss of the electromagnetic-coupling-type balun of FIG. 7.
Figure 9:
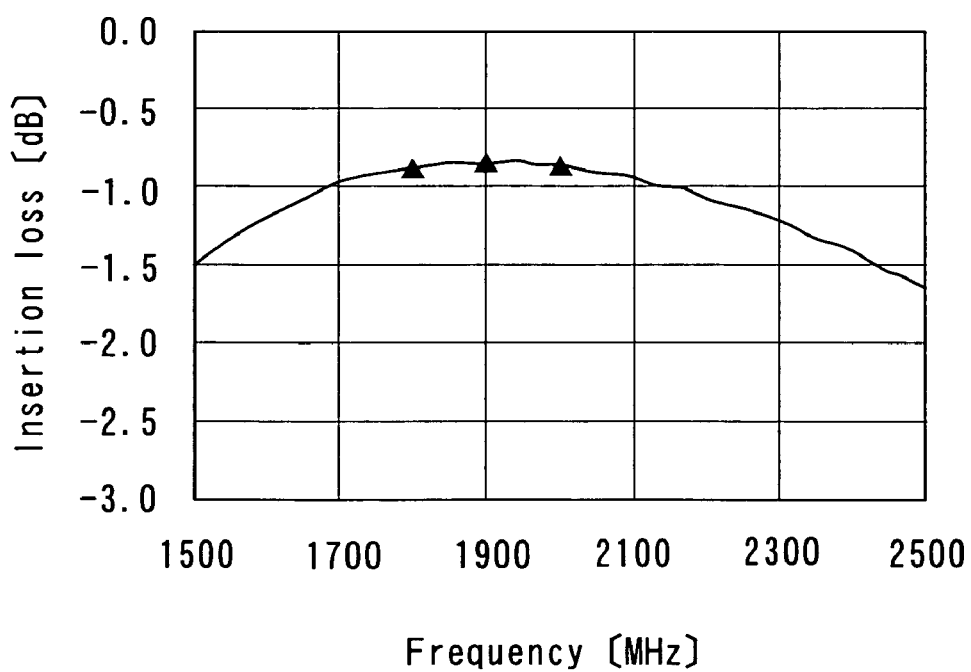
FIG. 9 is a plot showing a frequency characteristic of insertion loss of the electromagnetic-coupling-type balun of FIG. 7.
Figure 10:
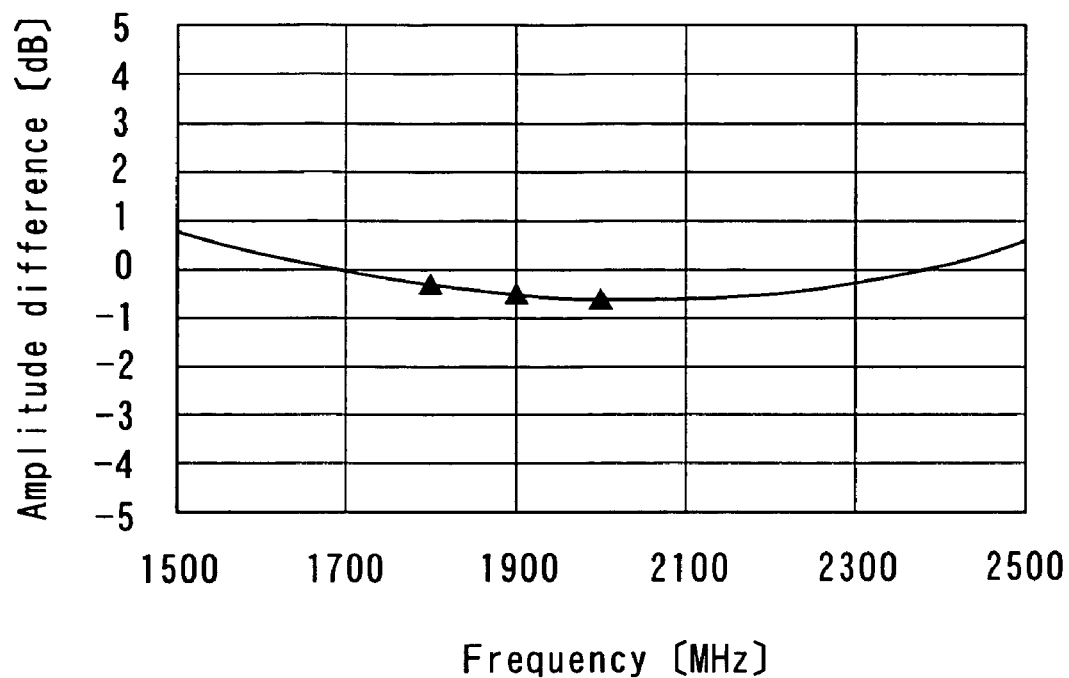
FIG. 10 is a plot showing a frequency characteristic of difference in amplitude between output signals at the two balanced terminals of the electromagnetic-coupling-type balun of FIG. 7.
Figure 11:
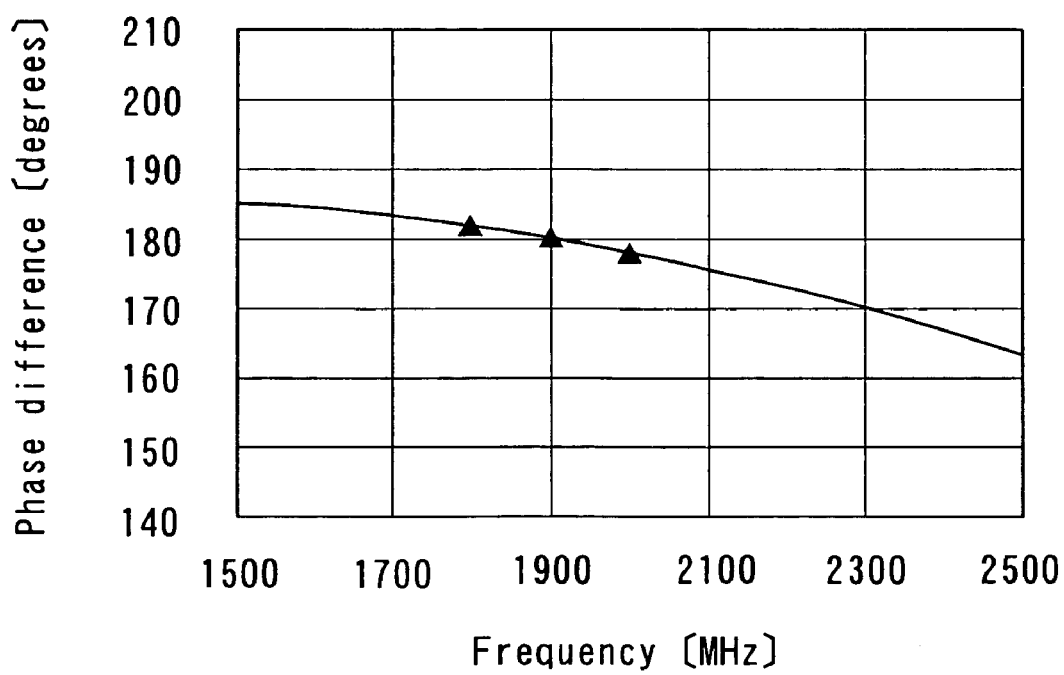
FIG. 11 is a plot showing a frequency characteristic of difference in phase between output signals at the two balanced terminals of the electromagnetic-coupling-type balun of FIG. 7.

FIG. 8 to FIG. 11 show the characteristics of the electromagnetic-coupling-type balun of FIG. 7. FIG. 8 shows the frequency characteristic of reflection loss. FIG. 9 shows the frequency characteristic of insertion loss. FIG. 10 shows the frequency characteristic of difference in amplitude between output signals at the balanced terminals 151 and 152 (hereinafter called the amplitude difference). FIG. 11 shows the frequency characteristic of difference in phase between output signals at the balanced terminals 151 and 152 (hereinafter called the phase difference).

Figure 12:
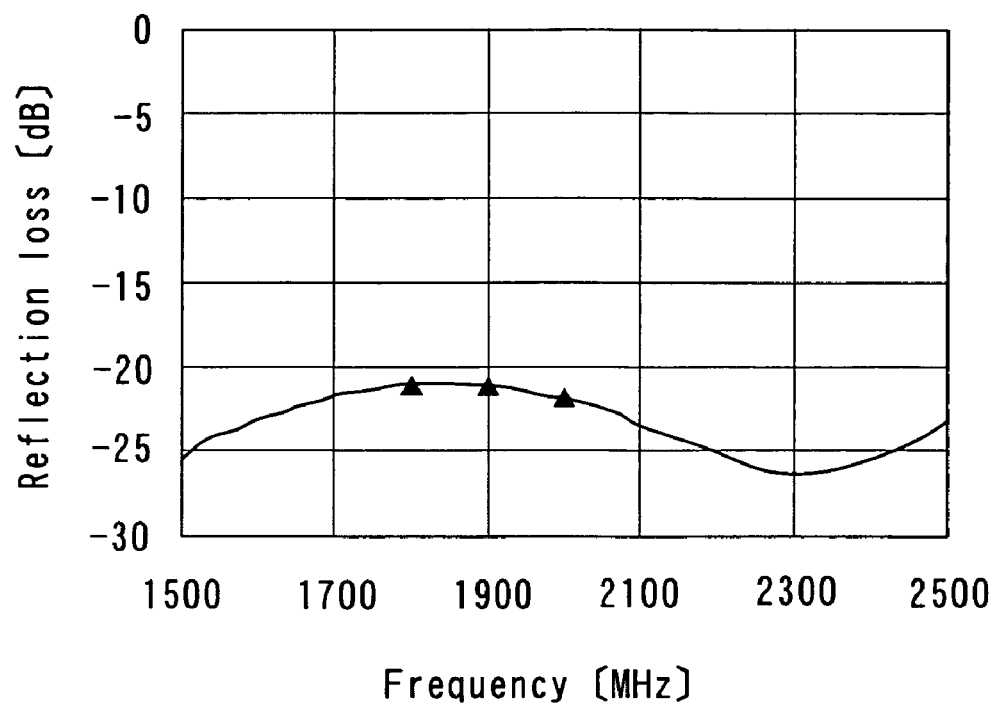
FIG. 12 is a plot showing a frequency characteristic of reflection loss of the reference balun of FIG. 4.
Figure 13:
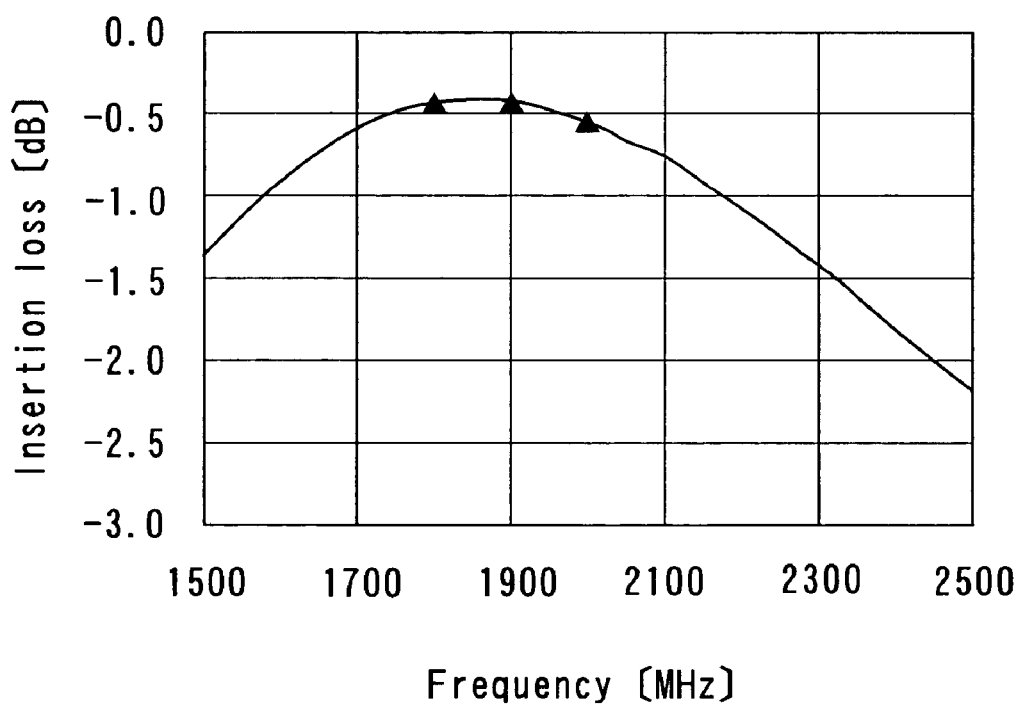
FIG. 13 is a plot showing a frequency characteristic of insertion loss of the reference balun of FIG. 4.
Figure 14:
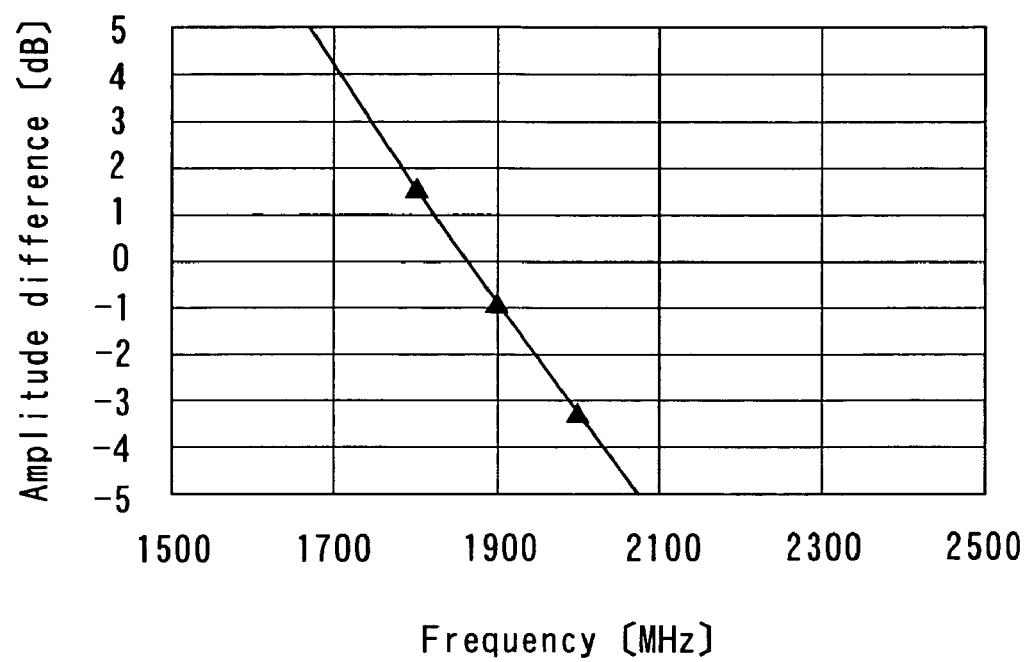
FIG. 14 is a plot showing a frequency characteristic of difference in amplitude between output signals at the two balanced terminals of the reference balun of FIG. 4.
Figure 15:
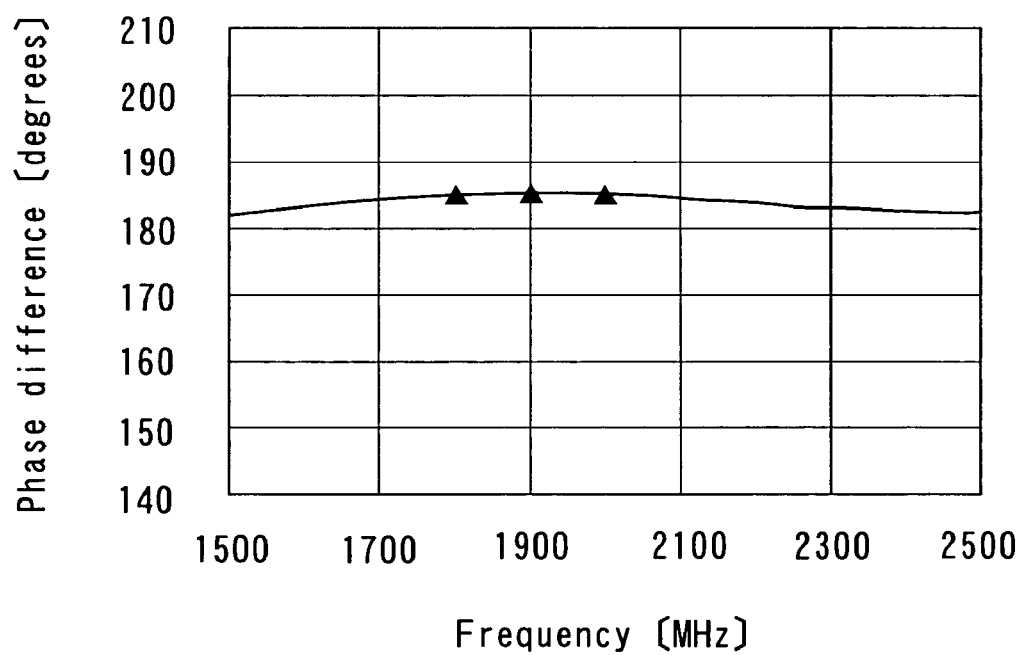
FIG. 15 is a plot showing a frequency characteristic of difference in phase between output signals at the two balanced terminals of the reference balun of FIG. 4.

FIG. 12 to FIG. 15 show the characteristics of the reference balun of FIG. 4. FIG. 12 shows the frequency characteristic of reflection loss. FIG. 13 shows the frequency characteristic of insertion loss. FIG. 14 shows the frequency characteristic of amplitude difference. FIG. 15 shows the frequency characteristic of difference in phase between output signals at the balanced terminals 111 and 112 (hereinafter called the phase difference).

Figure 16:
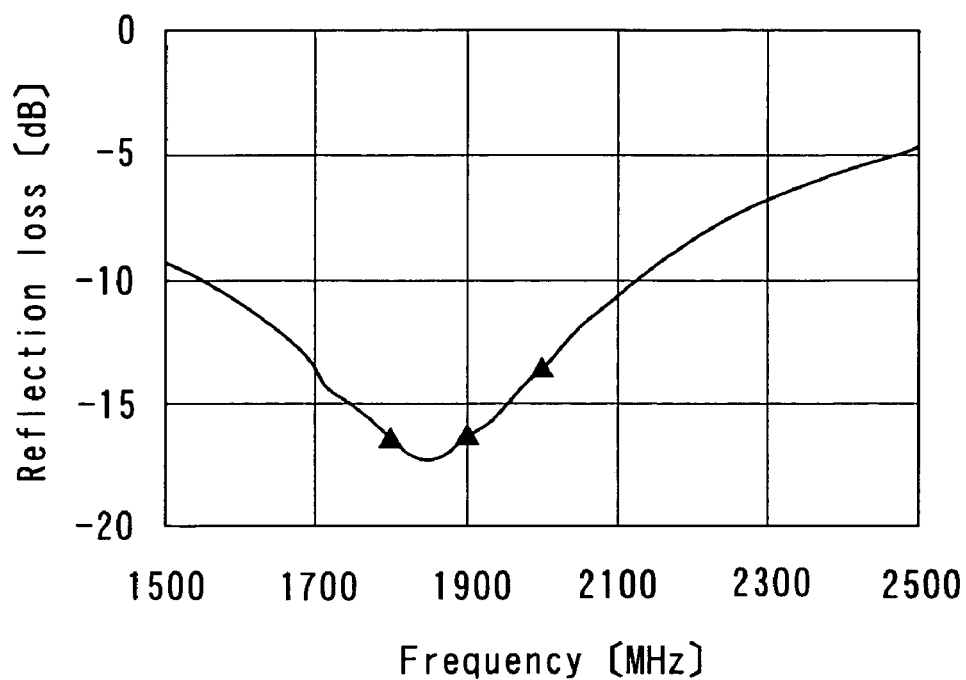
FIG. 16 is a plot showing a frequency characteristic of reflection loss of the balun of the first embodiment of the invention.
Figure 17:
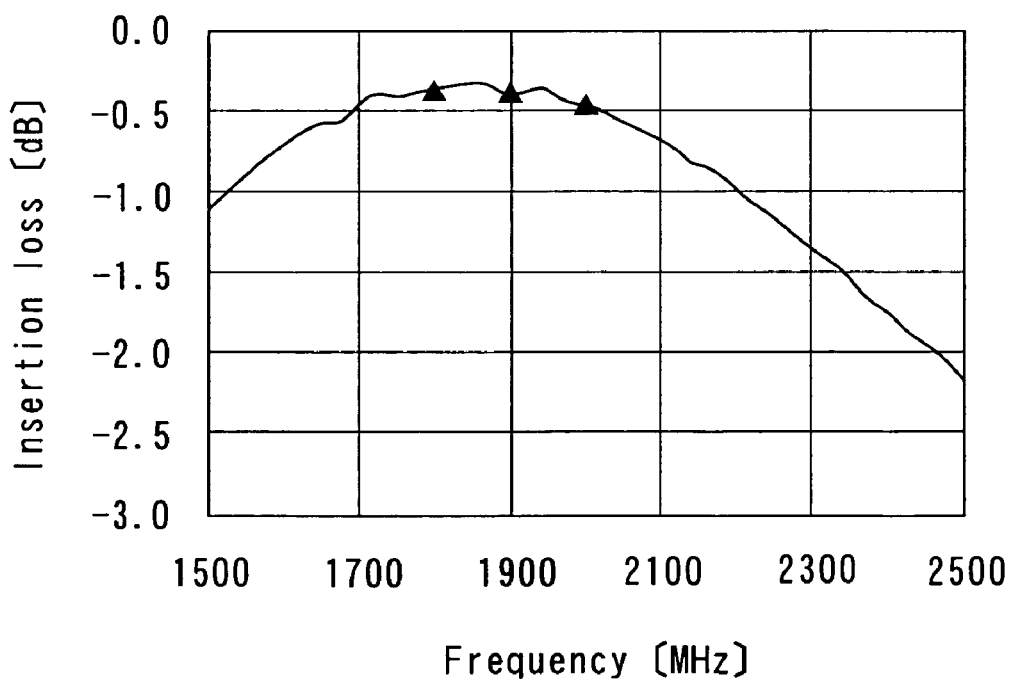
FIG. 17 is a plot showing a frequency characteristic of insertion loss of the balun of the first embodiment of the invention.
Figure 18:
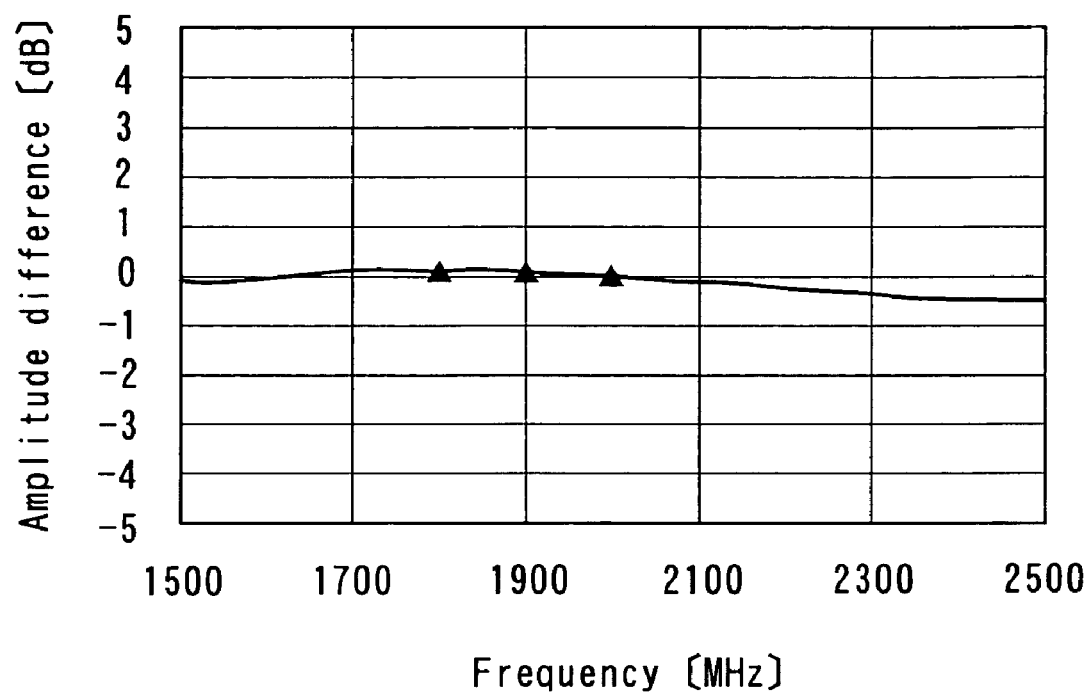
FIG. 18 is a plot showing a frequency characteristic of difference in amplitude between output signals at the two balanced terminals of the balun of the first embodiment of the invention.
Figure 19:
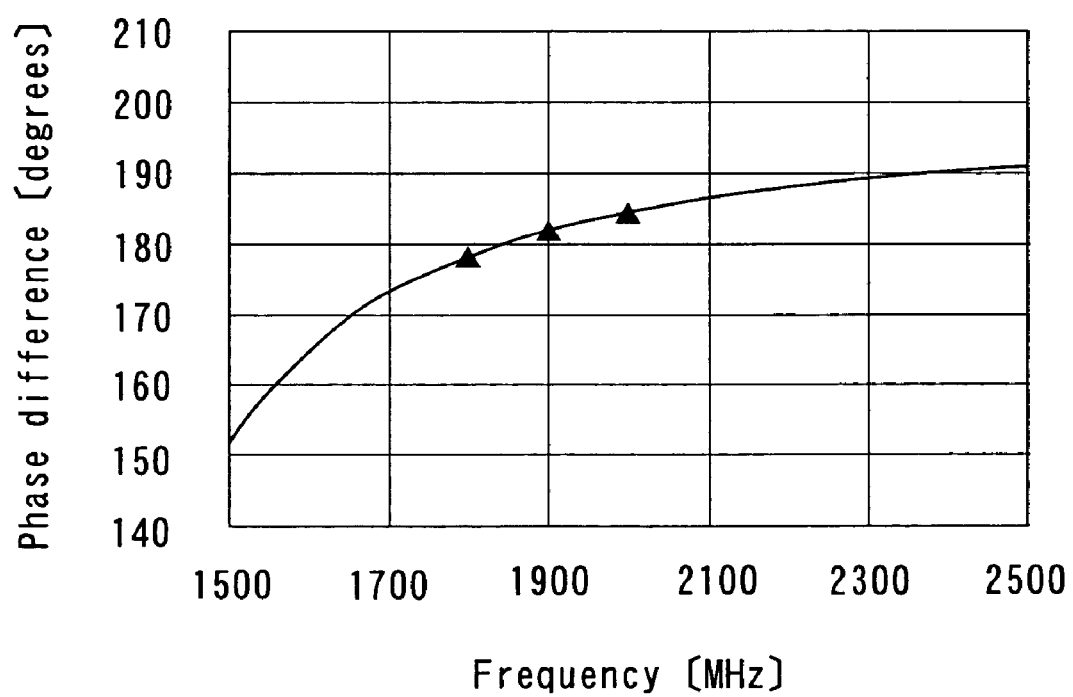
FIG. 19 is a plot showing a frequency characteristic of difference in phase between output signals at the two balanced terminals of the balun of the first embodiment of the invention.

FIG. 16 to FIG. 19 show the characteristics of the balun of the embodiment. FIG. 16 shows the frequency characteristic of reflection loss. FIG. 17 shows the frequency characteristic of insertion loss. FIG. 18 shows the frequency characteristic of amplitude difference. FIG. 19 shows the frequency characteristic of difference in phase between output signals at the balanced terminals 11 and 12 (hereinafter called the phase difference).

Typically, it is required that a multi-layer balun have the above-mentioned characteristics satisfying the following conditions in a frequency range in which the balun is used. That is, it is required that the reflection loss have an absolute value of 10 dB or greater. It is required that the insertion loss have an absolute value of 1.0 dB or smaller. It is required that the amplitude difference fall within a range of 0±1.0 dB. It is required that the phase difference fall within a range of 180±10 degrees.

As the comparison among FIG. 9, FIG. 13 and FIG. 17 shows, the electromagnetic-coupling-type balun has a greater insertion loss, compared with the reference balun of FIG. 4 and the balun of the embodiment. As a result, the usable frequency range falls within a range of approximately 1800 MHz to 2000 MHz for the electromagnetic-coupling-type balun having the characteristics shown in FIG. 8 to FIG. 11.

According to the reference balun of FIG. 4 and the balun of the embodiment, the insertion loss is small in a wider frequency range, compared with the electromagnetic-coupling-type balun. However, for the reference balun of FIG. 4, the frequency range in which the amplitude difference falls within a range of 0±1.0 dB is narrow, as shown in FIG. 14. For the reference balun having the characteristics shown in FIG. 12 to FIG. 15, the usable frequency range falls within a range of approximately 1800 MHz to 1900 MHz.

As shown in FIG. 18, for the balun of the embodiment, the amplitude difference falls within a range of 0±1.0 dB in a wider frequency range, compared with the reference balun. For the balun of the embodiment having the characteristics shown in FIG. 16 to FIG. 19, the usable frequency range falls within a range of approximately 1600 MHz to 2100 MHz.

As thus described, the embodiment achieves the balun that has a small insertion loss and provides a small difference in amplitude between output signals at the two balanced terminals in a wide frequency range.

According to the embodiment, the coils and the capacitors that the low-pass filter 21 and the high-pass filter 22 include are made up of the conductor layers of the multi-layer substrate 50. It is thereby possible to reduce the balun in size.

According to the embodiment, the two coils 31 and 32 in the low-pass filter 21 and the single coil 33 in the high-pass filter 22 are provided in locations that do not overlap one another when seen in the direction orthogonal to the layers of the multi-layer substrate 50. As a result, it is possible to prevent electromagnetic interference among the three coils 31, 32 and 33 so as to easily implement desired characteristics of the balun.

[Second Embodiment]

Reference is now made to FIG. 20A to FIG. 20G to describe a balun of a second embodiment of the invention. FIG. 20A to FIG. 20G illustrate examples of configurations of layers of the multi-layer substrate 50 making up the balun of the second embodiment. FIG. 20A to FIG. 20G illustrate first to seventh conductor layers from the top and a dielectric layer therebelow. In the embodiment the layers of FIG. 20D to FIG. 20G have configurations the same as those of the layers of FIG. 3D to FIG. 3G.

Figure 20A:
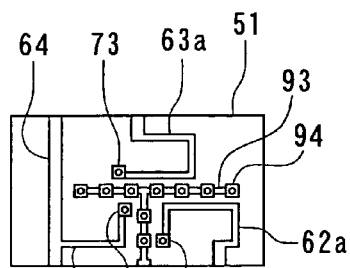
FIG. 20A to FIG. 20G illustrate examples of configurations of layers of a multi-layer substrate making up a balun of a second embodiment of the invention.

According to the second embodiment, on the top surface of the dielectric layer 51, as shown in FIG. 20A, a conductor layer 93 for separating coils is formed in addition to the conductor layers of FIG. 3A. The conductor layer 93 is T-shaped and disposed to divide the three regions in which the conductor layers 61a, 62a and 63a for the coils are located. The conductor layer 93 is connected to the ground terminal 13. The dielectric layer 51 has a plurality of through holes 94 connected to the conductor layer 93.

Figure 20B:
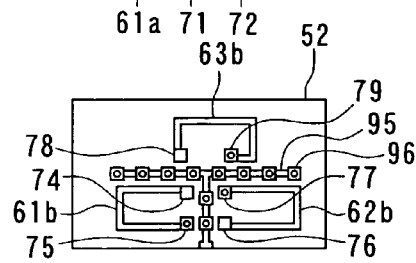

According to the embodiment, on the top surface of the dielectric layer 52, as shown in FIG. 20B, a conductor layer 95 for separating coils is formed in addition to the conductor layers of FIG. 3B. The conductor layer 95 is T-shaped and disposed to divide the three regions in which the conductor layers 61b, 62b and 63b for the coils are located. The conductor layer 95 is connected to the ground terminal 13. The dielectric layer 52 has a plurality of through holes 96 connected to the conductor layer 95. The through holes 96 are connected to the through holes 94 of FIG. 20A.

Figure 20C:
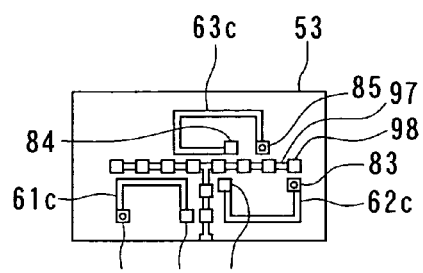
Figure 20D:
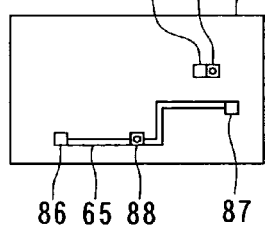
Figure 20E:
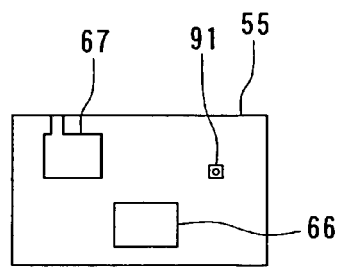
Figure 20F:
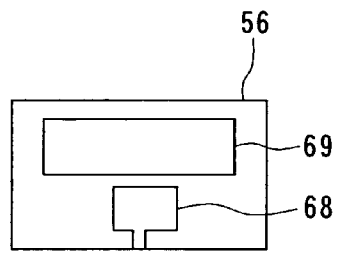
Figure 20G:
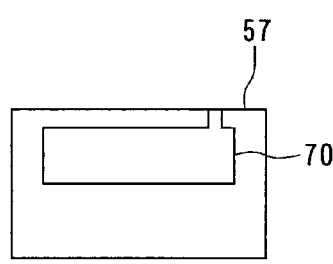

According to the embodiment, on the top surface of the dielectric layer 53, as shown in FIG. 20C, a conductor layer 97 for separating coils is formed in addition to the conductor layers of FIG. 3C. The conductor layer 97 is T-shaped and disposed to divide the three regions in which the conductor layers 61c, 62c and 63c for the coils are located. The conductor layer 97 is connected to the ground terminal 13. On the top surface of the dielectric layer 53, a plurality of conductor layers 98 for connection to the through holes are formed. The conductor layers 98 are connected to the conductor layer 97. The conductor layers 98 are connected to the through holes 96 of FIG. 20B.

According to the embodiment, a separating section for electromagnetically separating the three coils 31 to 33 from one another is made up of the conductor layers 93, 95 and 97 for separating the coils, the through holes 94 and 96, and the conductor layers 98 for connection to the through holes shown in FIG. 20A to FIG. 20C. The separating section is disposed in the substrate 50 to divide the three regions in which the three coils 31 to 33 are located. The separating section is connected to the ground. Therefore, the separating section electromagnetically shields the coils 31 to 33 from one another. As a result, according to the embodiment, it is possible to prevent electromagnetic interference among the three coils 31, 32 and 33 with greater reliability so as to implement desired characteristics of the balun more easily.

The remainder of configuration, operations and effects of the second embodiment are similar to those of the first embodiment.

[Third Embodiment]

Figure 21:
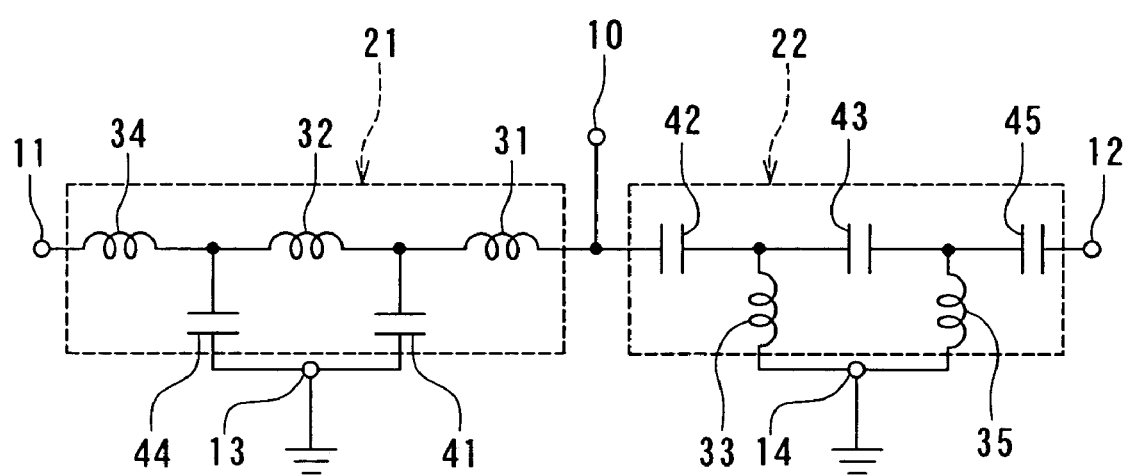
FIG. 21 is a schematic diagram illustrating the circuit configuration of a balun of a third embodiment of the invention.

Reference is now made to FIG. 21 to describe a balun of a third embodiment of the invention. FIG. 21 is a schematic diagram illustrating the circuit configuration of the balun of the third embodiment.

The low-pass filter 21 of the third embodiment incorporates a coil 34 and a capacitor 44 in addition to the coils 31 and 32 and the capacitor 41 of FIG. 1. The coil 34 is inserted between the coil 32 and the first balanced terminal 11. The capacitor 44 has an end connected to the node between the coil 32 and the coil 34. The capacitor 44 has the other end connected to the ground terminal 13.

The high-pass filter 22 of the third embodiment incorporates a capacitor 45 and a coil 35 in addition to the capacitors 42 and 43 and the coil 33 of FIG. 1. The capacitor 45 is inserted between the capacitor 43 and the second balanced terminal 12. The coil 35 has an end connected to the node between the capacitor 43 and the capacitor 45. The coil 35 has the other end connected to the ground terminal 14.

As the first embodiment, the balun of the third embodiment comprises the multi-layer substrate 50, and the coils and the capacitors shown in FIG. 20A to FIG. 20G are made up of the conductor layers of the multi-layer substrate 50. The balun of the third embodiment incorporates the two coils 34 and 35 and the two capacitors 44 and 45 in addition to the components of the balun of the first embodiment. It is also possible to form these coils and capacitors through the use of the conductor layers of the multi-layer substrate 50 by a method the same as the method of forming the coils and the capacitors of FIG. 3A to FIG. 3G. According to the third embodiment, it is preferred that the five coils 31 to 35 are provided in locations that do not overlap one another when seen in the direction orthogonal to the layers of the multi-layer substrate 50.

As in the second embodiment, a separating section for electromagnetically separating the five coils 31 to 35 from one another may be provided in the third embodiment, too.

The remainder of configuration, operations and effects of the third embodiment are similar to those of the first embodiment.

The present invention is not limited to the foregoing embodiments but may be practiced in still other ways. According to the invention, it is acceptable that the low-pass filter incorporates at least two coils and at least one capacitor, and that the high-pass filter incorporates at least two capacitors and at least one coil. Therefore, the low-pass filter may have the configuration of the first embodiment while the high-pass filter may have the configuration of the third embodiment, for example. Alternatively, the low-pass filter may have the configuration of the third embodiment while the high-pass filter may have the configuration of the first embodiment. The low-pass filter may have a configuration in which another pair or more of a coil and a capacitor are inserted between the coil 34 and the first balanced terminal 11 of the low-pass filter 21 of FIG. 21, wherein the positional relationship between the coil and the capacitor is the same as that of the coil 34 and the capacitor 44. Similarly, the high-pass filter may have a configuration in which another pair or more of a capacitor and a coil are inserted between the capacitor 45 and the second balanced terminal 12 of the high-pass filter 22 of FIG. 21, wherein the positional relationship between the capacitor and the coil is the same as that of the capacitor 45 and the coil 35.

In the balun of the invention, if the low-pass filter and the high-pass filter include a total of at least three coils made up of the conductor layers of the multi-layer substrate, regardless of the circuit configurations of the low-pass filter and the high-pass filter, the at least three coils may be provided in locations that do not overlap one another when seen in the direction orthogonal to the layers of the layered structure. In this case, a separating section for electromagnetically separating the at least three coils from one another may be provided.

Obviously many modifications and variations of the present invention are possible in the light of the above teachings. It is therefore to be understood that within the scope of the appended claims the invention may be practiced otherwise than as specifically described.

What is claimed is:

1. A balun comprising:
    an unbalanced terminal for receiving and outputting unbalanced signals;
    a first balanced terminal and a second balanced terminal for receiving and outputting balanced signals;
    a low-pass filter provided between the unbalanced terminal and the first balanced terminal;
    a high-pass filter provided between the unbalanced terminal and the second balanced terminal; and
    a layered structure including dielectric layers and conductor layers alternately stacked, wherein:
    the low-pass filter and the high-pass filter include a total of at least three coils and a total of at least three capacitors;
    the at least three coils are disposed opposite to the at least three capacitors, with one of the dielectric layers in the layered structure disposed between the coils and the capacitors;
    the at least three coils are disposed in locations that do not overlap one another when seen in a direction orthogonal to the layers of the layered structure;
    each of the at least three coils includes a plurality of coil-forming conductor layers that are disposed on different ones of the dielectric layers of the layered structure and connected via at least one through hole; and
    the at least three capacitors are formed using a plurality of capacitor-forming conductor layers disposed on at least three of the dielectric layers of the layered structure, and at least one of the plurality of capacitor-forming conductor layers is disposed in a location sandwiched by other two of the plurality of capacitor-forming conductor layers located above and below, and is shared among a plurality of capacitors.

2. The balun according to claim 1, wherein:
    the low-pass filter includes at least one coil and at least one capacitor, the number of the at least one coil and the at least one capacitor being three in total; and
    the high-pass filter includes at least one coil and at least one capacitor, the number of the at least one coil and the at least one capacitor being three in total.

3. The balun according to claim 1, wherein the unbalanced terminal and the first and second balanced terminals are disposed on the periphery of the layered structure, so that the balun makes up a single chip-shaped electronic component.

4. The balun according to claim 1, wherein:
    the low-pass filter includes at least two coils and at least one capacitor; and
    the high-pass filter includes at least two capacitors and at least one coil.

5. The balun according to claim 1, further comprising a separating section made up of the conductor layers and electromagnetically separating the at least three coils from one another.

6. The balun according to claim 1, further comprising a ground terminal connected to a ground, wherein:

the low-pass filter incorporates: a first coil having an and connected to the unbalanced terminal; a second coil having an end connected to the other end of the first coil and having the other end connected to the first balanced terminal; and a first capacitor having an end connected to the other end of the first coil and having the other end connected to the ground terminal; and the high-pass filter incorporates: a second capacitor having an end connected to the unbalanced terminal; a third capacitor having an end connected to the other end of the second capacitor and having the other end connected to the second balanced terminal; and a third coil having an end connected to the other end of the second capacitor and having the other end connected to the ground terminal.

7. The balun according to claim 1, wherein neither a signal path between the unbalanced terminal and the first balanced terminal nor a signal path between the unbalanced terminal and the second balanced terminal includes a portion for transmitting signals through electromagnetic coupling.

8. A balun comprising:
an unbalanced terminal for receiving and outputting unbalanced signals;
a first balanced terminal and a second balanced terminal for receiving and outputting balanced signals;
a low-pass filter provided between the unbalanced terminal and the first balanced terminal;
a high-pass filter provided between the unbalanced terminal and the second balanced terminal; and
a layered structure including dielectric layers and conductor layers alternately stacked, wherein:
the low-pass filter and the high-pass filter include a total of at least three coils made up of the conductor layers;
the at least three coils are provided in locations that do not overlap one another when seen in a direction orthogonal to the layers of the layered structure;
each of the at least three coils includes a plurality of coil-forming conductor layers that are disposed on different ones of the dielectric layers of the layered structure and connected via at least one through hole;
the balun further comprises a separating section made up of the conductor layers and electromagnetically separating the at least three coils from one another; and
the separating section includes: a plurality of coil-separating conductor layers that are respectively disposed on the ones of the dielectric layers on which the respective coil-forming conductor layers are disposed; and a plurality of through holes for connecting the plurality of coil-separating conductor layers.

9. The balun according to claim 8, further comprising a ground terminal connected to a ground, wherein:
the low-pass filter incorporates: a first coil having an end connected to the unbalanced terminal; a second coil having an end connected to the other end of the first coil and having the other end connected to the first balanced terminal; and a first capacitor having an end connected to the other end of the first coil and having the other end connected to the ground terminal; and
the high-pass filter incorporates: a second capacitor having an end connected to the unbalanced terminal; a third capacitor having an end connected to the other end of the second capacitor and having the other end connected to the second balanced terminal; and a third coil having an end connected to the other end of the second capacitor and having the other end connected to the ground terminal.

10. The balun according to claim 8, wherein neither a signal path between the unbalanced terminal and the first balanced terminal nor a signal path between the unbalanced terminal and the second balanced terminal includes a portion for transmitting signals through electromagnetic coupling.

11. The balun according to claim 8, wherein:
the low-pass filter includes at least one coil and at least one capacitor, the number of the at least one coil and the at least one capacitor being three in total; and
the high-pass filter includes at least one coil and at least one capacitor, the number of the at least one coil and the at least one capacitor being three in total.

12. The balun according to claim 8, wherein the unbalanced terminal and the first and second balanced terminals are disposed on the periphery of the layered structure, so that the balun makes up a single chip-shaped electronic component.

13. The balun according to claim 8, wherein:
the low-pass filter includes at least two coils and at least one capacitor; and
the high-pass filter includes at least two capacitors and at least one coil.

* * * * *